(12) United States Patent
Sporon-Fiedler et al.

(10) Patent No.: US 9,992,866 B2
(45) Date of Patent: Jun. 5, 2018

(54) PRINTED CIRCUIT BOARD ARRANGEMENT AND ELECTRONIC DEVICE HAVING A PRINTED CIRCUIT BOARD DEVICE

(71) Applicant: BIOTRONIK SE & Co. KG, Berlin (DE)

(72) Inventors: Frederik Sporon-Fiedler, Corvallis, OR (US); Bjoern Brunner, Portland, OR (US); Jana Carraway, Tigard, OR (US); Ken Kramer, Lake Oswego, OR (US)

(73) Assignee: BIOTRONIK SE & Co. KG, Berlin (DE)

( * ) Notice: Subject to any disclaimer, the term of this patent is extended or adjusted under 35 U.S.C. 154(b) by 34 days.

(21) Appl. No.: 15/058,491

(22) Filed: Mar. 2, 2016

(65) Prior Publication Data

US 2016/0295693 A1  Oct. 6, 2016

Related U.S. Application Data

(60) Provisional application No. 62/140,456, filed on Mar. 31, 2015.

(51) Int. Cl.
| | |
|---|---|
| A61B 5/00 | (2006.01) |
| H05K 1/03 | (2006.01) |
| H05K 1/02 | (2006.01) |
| A61N 1/375 | (2006.01) |
| H05K 1/11 | (2006.01) |
| H05K 3/00 | (2006.01) |

(52) U.S. Cl.
CPC ......... *H05K 1/0306* (2013.01); *A61N 1/375* (2013.01); *H05K 1/02* (2013.01); *H05K 1/111* (2013.01); *H05K 1/117* (2013.01); *H05K 3/0058* (2013.01); *H05K 3/0067* (2013.01); *H05K 2201/0108* (2013.01); *H05K 2201/0999* (2013.01); *H05K 2201/09145* (2013.01); *H05K 2201/09845* (2013.01); *H05K 2203/30* (2013.01)

(58) Field of Classification Search
USPC ........................................... 607/119; 600/306
See application file for complete search history.

(56) References Cited

U.S. PATENT DOCUMENTS

2012/0236512 A1    9/2012  Liu et al.
2013/0041235 A1*   2/2013  Rogers ................ A61B 5/6867
                                                        600/306

FOREIGN PATENT DOCUMENTS

EP          0 242 020         10/1987

OTHER PUBLICATIONS

European Search Report and Annex to the European Search Report on European Patent Application No. EP 16 16 0133, dated Sep. 20, 2016 (5 pages).

* cited by examiner

*Primary Examiner* — Nicole F Johnson
(74) *Attorney, Agent, or Firm* — Buchanan Ingersoll & Rooney PC

(57) ABSTRACT

An electronic device, in particular for a medical implant, and a printed circuit board arrangement including a printed circuit board, wherein at least one UV-transparent element is at least fixedly coupled to the printed circuit board, wherein the UV-transparent element is intended for fixation of the printed circuit board in an electronic device.

16 Claims, 3 Drawing Sheets

PRINTED CIRCUIT BOARD ARRANGEMENT AND ELECTRONIC DEVICE HAVING A PRINTED CIRCUIT BOARD DEVICE

CROSS-REFERENCE TO RELATED APPLICATIONS

This patent application claims the benefit of U.S. Provisional Patent Application No. 62/140,456, filed on Mar. 31, 2015, which is hereby incorporated by reference in its entirety.

TECHNICAL FIELD

The present invention relates to a printed circuit board arrangement and an electronic device having a printed circuit board arrangement and, in particular, an electronic device in an implantable medical device.

BACKGROUND

As part of manufacturing inner assemblies for electronic devices, in particular electronic devices for medical implants which are intended to be implanted into a human or animal body, it is generally necessary to fixate the electronic printed circuit board ("PCB") to mechanical support features in the assembly. This is necessary to ensure that the electronic device does not move around under normal use conditions including insertion into the device housing, thereby imparting stresses to the solder joints and components. These stresses can lead to cracks with crack growth ultimately leading to interconnect failures. Further, because of the very limited size of an implant, the electronic device has to be significantly miniaturized, thus leaving virtually no free real estate on the printed circuit board.

Several approaches have been deployed over the years to achieve fixation of the circuit boards to mechanical support features, such as, providing clips on the mechanical support frame to retain the circuit board, providing thermal staking of polymer pins from the support frame onto the circuit board, providing adhesive tapes (e.g., Polyimide tape) to retain the circuit board in position, and providing thermally cured adhesive resins to glue the PCB onto the support frame. Clips on the mechanical support requires complex mechanical support frame mold tool design (to form the clips) and use of substrate real estate to form "shelves" to provide counter-force to support the clip forces. Providing thermal or ultrasonic staking of polymer pins from the support frame onto the circuit board requires use of larger board real estate to capture the staking and for the staking tool to form the pin. This approach also uses high temperatures or vibrations in proximity to possibly sensitive components, such as, for example, multi-layer ceramic capacitors ("MLCC"). The use of adhesive tapes to retain the circuit board in position requires difficult tape handling and positioning operations and may not lead to firm retention of the printed circuit board in its intended position. The use of thermally cured adhesive resins to glue the PCB onto the support frame requires use of adhesive resins which generally have long cure/cooling cycle times of more than 10 minutes and high temperatures, up to 125° C., which can damage or warp other components, such as the polymer frames.

The present invention is directed toward overcoming one or more of the above-mentioned problems.

SUMMARY

It is an object of the present invention to provide a printed circuit board arrangement for an electronic device having a printed circuit board which requires less real estate for fixation of the printed circuit board and does not require high temperatures or long cure times for fixation of the printed circuit board to a mechanical support.

Another object of the present invention is to provide an electronic device having a printed circuit board which requires less real estate for fixation of the printed circuit board and which does not require high temperatures for fixating of the printed circuit board to a mechanical support.

Another object of the present invention is to provide a method for manufacturing such an electronic device.

At least the above objects are achieved by the features of the independent claims. The other claims, the drawings, and the specification disclose advantageous embodiments of the invention.

A printed circuit board arrangement is proposed comprising a printed circuit board, wherein at least one UV-transparent element is at least fixedly coupled to the printed circuit board, wherein the UV-transparent element is intended for fixation of the printed circuit board in an electronic device.

The UV-transparent element may be an element separate from the printed circuit board which is attached to the printed circuit board, or it may be integrated into the printed circuit board. The printed circuit board may be rigid or flexible.

The printed circuit board is made of materials which are not transparent to ultraviolet radiation ("UV radiation"). Typically, polyimide is used for flexible printed circuit boards and glass filled adhesive resins are used in rigid printed circuit boards which are both nearly opaque in the UV range. Adhesive resins which are curable with ultraviolet radiation cannot be used for fixation of the printed circuit board, but by providing a UV-transparent element, adhesive resins become suitable for UV fixation of the printed circuit board.

The inventive printed circuit board arrangement allows reduction of the required board real estate for fixation, as well reduction of the temperatures and times required to form the fixation because curing can be effected by UV irradiation which is known to provide near instantaneous curing on properly formulated epoxies. This allows for economical manufacturing and facilitates the assembly of electronic devices which include such printed circuit board arrangements.

According to a favorable embodiment, the UV-transparent element may be arranged along the perimeter of the printed circuit board. The perimeter is easy to access, and real estate required for the UV-transparent element on the printed circuit board is thereby minimized. Circuitry arranged in or on the printed circuit board remains undisturbed by the UV-transparent element.

According to a favorable embodiment, the UV-transparent element may be made of glass. In particular, the UV-transparent element may have a thickness of not more than 200 μm, preferably not more than 100 μm, and more preferably of not more than 50 μm. The UV-transparent element is stable and has a transmission for UV which is sufficient for curing resins beneath the UV-transparent element.

According to another aspect of the present invention, an electronic device is proposed, in particular, an electronic device for a medical implant, comprising a printed circuit board, wherein at least one UV-transparent element is at least fixedly coupled to the printed circuit board in a position, which is intended as an interface for fixation of the printed circuit board in the device.

Advantageously, the design and construction of an electronic device is facilitated by the device comprising a flexible or rigid printed circuit board with UV-transparent elements or areas.

A very fast and secure fixation process is enabled. By providing UV-transparent elements, UV-curable resins can be used for connecting the UV-transparent element to a counterpart. The fixation process requires only seconds for curing a UV-curable resin. This translates into lower manufacturing cost and cycle time during manufacture. The position of the printed circuit board in relation to the underlying fixation point on a mechanical feature, such as, for example, a mechanical support or a frame, can be maintained by appropriate process tooling.

According to a favorable embodiment, the UV-transparent element may be a joining component between the printed circuit board and a counterpart, such as, for example, a mechanical support or a frame, to the printed circuit board for establishing a rigid connection between the printed circuit board and the counterpart.

According to a favorable embodiment, a UV curable adhesive may be arranged between the UV-transparent element and the counterpart. In particular the UV curable adhesive may be an UV curable resin, preferably, epoxy resin, polyurethane, acrylate polymer or silicone resin. This allows for a fast and accurate fixation process.

The size of fixation features may be made very small, in particular, having a diameter of only 75-200 μm, limited by the size of an ablation window in the printed circuit board. It is possible to make this window using the same ablation laser as is used for drilling vias into the printed circuit board during standard printed circuit board fabrication.

Only a minimum dispense volume of adhesive resin is necessary, thereby reducing required substrate area required to accomplish fixation. This translates into size reduction of the final device design.

According to a favorable embodiment, the UV-transparent element may be arranged along the perimeter of the printed circuit board. The perimeter is easily accessible during manufacture and valuable real estate of the printed circuit board is saved for the electronic circuitry on the board, and allowing use of fast curing UV epoxy resins to achieve retention of the printed circuit board to mechanical supports or frame features.

In a further preferred embodiment, the UV-transparent element may be integrated into the printed circuit board. The printed circuit board may be rigid or flexible.

According to a favorable embodiment, the UV-transparent element may be made of glass, preferably having a thickness of not more than 200 μm, preferably not more than 100 μm, and more preferably of not more than 50 μm.

According to another aspect of the present invention, an implantable medical device is proposed, in particular, an implantable leadless pacemaker, having an electronic device comprising a printed circuit board, wherein at least one UV-transparent element is at least fixedly coupled to the printed circuit board, wherein the UV-transparent element is intended for fixation of the printed circuit board in an electronic device.

As part of manufacturing inner assemblies for such electronics, in particular, medical electronics, it is generally necessary to fixate the electronic circuit board to mechanical support features in the assembly. Advantageously, it can be ensured that the electronics are securely attached and do not move around under normal use conditions, which would impart stresses to the solder joints and components. By avoiding such stresses, damage to the implant, such as, for example, cracks and crack growth ultimately leading to interconnect failures can be avoided.

According to another aspect of the present invention, a method for manufacturing an electronic device is proposed, with the steps of providing a printed circuit board arrangement comprising a printed circuit board having at least one UV-transparent element coupled to or integrated in the printed circuit board for fixation of the printed circuit board; providing a counterpart on which the printed circuit board is to be fixated; dispensing a UV-curable adhesive on the counterpart and/or the UV-transparent element in an area intended as interface for fixation of the printed circuit board; illuminating the UV-transparent element with UV radiation; and curing the UV-curable adhesive.

Advantageously, curing the UV-curable adhesive is performed with an ablation laser, the ablation laser being used for drilling one or more vias in the printed circuit board.

Further embodiments, features, aspects, objects, advantages, and possible applications of the present invention could be learned from the following description, in combination with the Figures, and the appended claims.

DESCRIPTION OF THE DRAWINGS

The present invention together with the above-mentioned and other objects and advantages may best be understood from the following detailed description of the embodiments, but not restricted to the embodiments, wherein is shown in.

DETAILED DESCRIPTION

Figure 1:
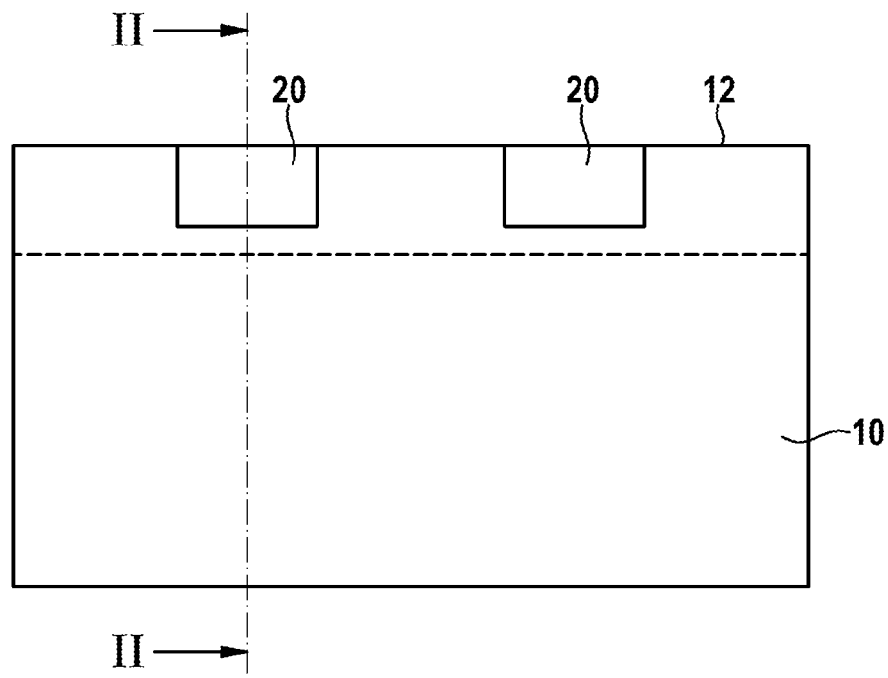
FIG. 1 shows a plan view of a printed circuit board arrangement comprising a printed circuit board and a UV-transparent element at a perimeter of the printed circuit board according to an embodiment of the present invention.

In the drawings, like elements are referred to with equal reference numerals. The drawings are merely schematic representations, not intended to portray specific parameters of the present invention. Moreover, the drawings are intended to depict only typical embodiments of the invention and therefore should not be considered as limiting the scope of the invention.

Figure 2:
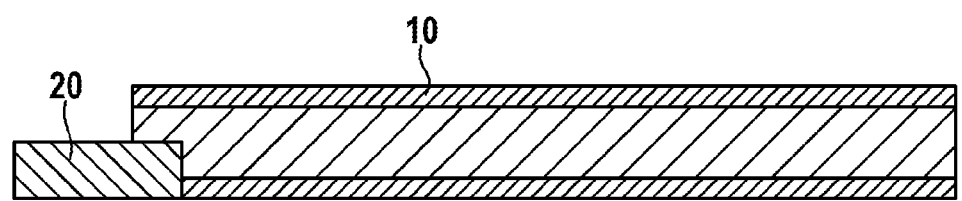
FIG. 2 shows a section view the of the printed circuit board arrangement along line II-II of FIG. 1.

FIGS. 1 and 2 depict in a plan view (FIG. 1) and a section view (FIG. 2) a printed circuit board arrangement according an embodiment of the present invention. The printed circuit board arrangement comprises a printed circuit board 10 and two UV-transparent elements 20 arranged at a perimeter 12 of the printed circuit board 10.

The printed circuit board 10 may be a standard printed circuit board with the UV-transparent elements 20 attached to the perimeter 12 or integrated into the perimeter 12.

A category of adhesive resins known as UV-curable adhesive resins have the desirable characteristics of nearly instantaneous curing when illuminated with ultraviolet light in the 320-380 nm range. By including a strip of very thin glass as a UV-transparent element 20, e.g., 50-75 µm thick, along the perimeter 12 of the printed circuit board 10, the UV light required by such adhesive resins for catalyzing the curing process is able to reach the adhesive resin beneath the UV-transparent element 20. The UV-transparent element 20 may be included, for instance, during the board manufacturing. Example of these adhesive resins are epoxy resin, polyurethane, acrylate polymer or silicone resin.

Figure 3:
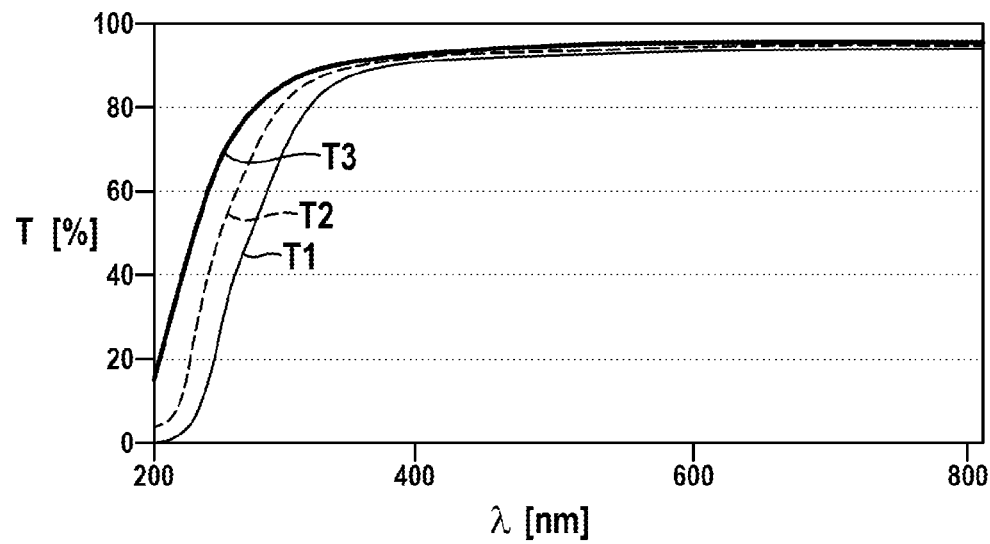
FIG. 3 shows a chart indicating transmission versus wavelength of commercially available glass as a function of glass thickness.

A suitable glass shall be more than 80% transmissive at the wavelength of interest in the UV range, as shown in FIG. 3. FIG. 3 depicts a chart indicating transmission (in percent) versus wavelength (in nm) of such glass as a function of glass thickness. T1 is a curve for a glass strip of 200 µm thickness, T2 is a curve for a glass strip of 100 µm thickness, and T3 is a curve for a glass strip of 50 µm thickness. An example of a suitable glass is called "Corning Willow glass".

Figure 4:
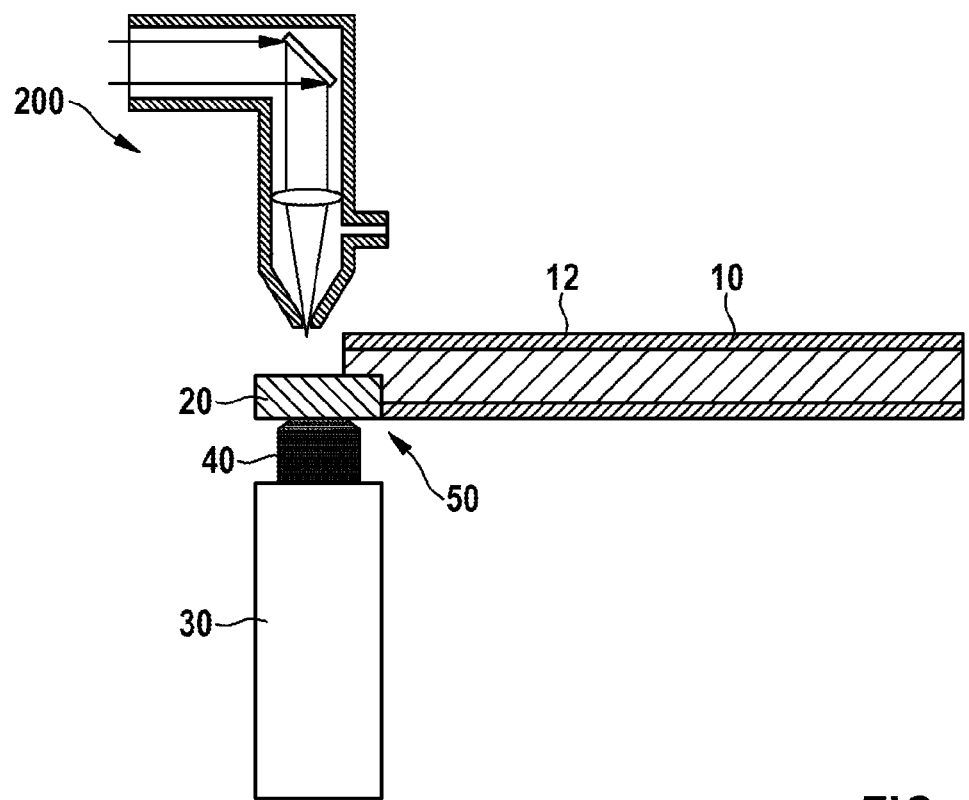
FIG. 4 shows schematically a process step during manufacture of an electronic device according to an embodiment of the present invention.

FIG. 4 illustrates schematically a process step during manufacture of an electronic device arrangement according to an embodiment of the present invention. During the manufacturing of the printed circuit board 10, the polyimide and adhesives overlaying the fixation points 50 at the perimeter 12 of the board 10 can be opened up using the same UV laser ablation system 200 used to drill vias in the printed circuit board 10, leaving behind the glass openings through which either UV laser or arc-lamps can illuminate the underlying adhesive resins 50. This is shown schematically in FIG. 4, where a printed circuit board 10 is rigidly attached to a mechanical support as counterpart 30 via curing an adhesive resin dot as a UV curable adhesive 40 underneath a UV transparent element 20 coupled to the printed circuit board 10.

An electronic device 100 can be manufactured by providing a printed circuit board arrangement comprising the printed circuit board 10 having at least one UV-transparent element 20 coupled to or integrated in the printed circuit board 10 for fixation of the printed circuit board 10 to a counterpart 30, dispensing a UV-curable adhesive 40 on the counterpart 30 and/or the UV-transparent element 20 in an area intended as interface 50 for fixation of the printed circuit board 10, and illuminating the UV-transparent element 20 with UV radiation and, thus, curing the UV-curable adhesive so that a rigid connection is established between the printed circuit board 10 and the counterpart 30 via the UV-transparent element 20.

Figure 5:
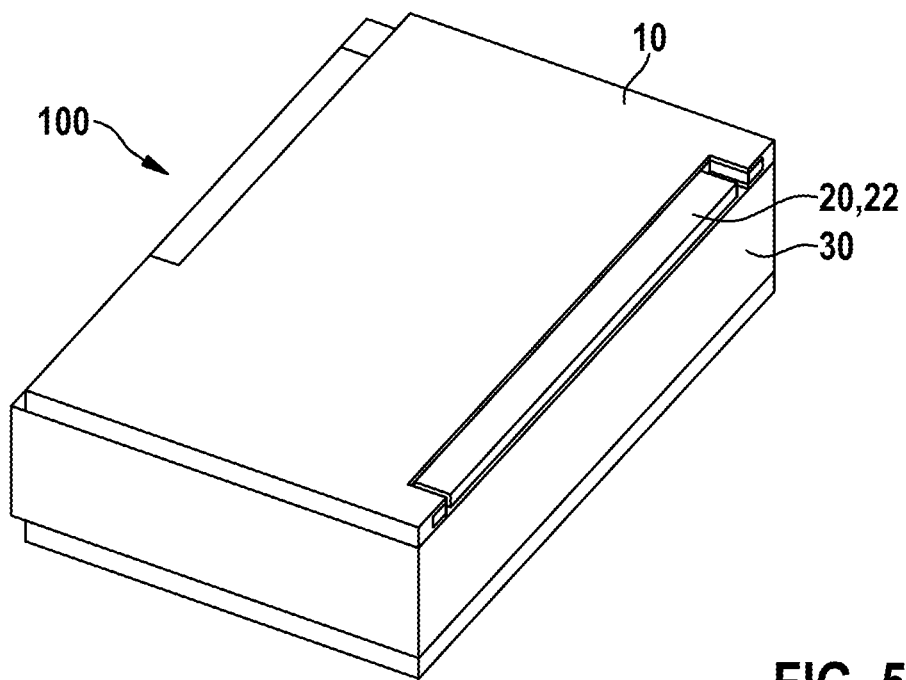
FIG. 5 shows an example embodiment of an electronic device comprising a flexible printed circuit board fixated to a mechanical frame.

The benefits of this approach for fixation on a miniaturized electronic assembly is shown schematically in FIG. 5, which shows a flexible printed circuit board 10 folded around a mechanical frame as counterpart 30 that has one surface which is mounted to the printed circuit board 10, and the fixation is made with a window 22 as the UV-transparent element 20.

It will be apparent to those skilled in the art that numerous modifications and variations of the described examples and embodiments are possible in light of the above teachings of the disclosure. The disclosed examples and embodiments are presented for purposes of illustration only. Other alternate embodiments may include some or all of the features disclosed herein. Therefore, it is the intent to cover all such modifications and alternate embodiments as may come within the true scope of this invention, which is to be given the full breadth thereof. Additionally, the disclosure of a range of values is a disclosure of every numerical value within that range.

We claim:

1. An electronic device comprising:
    a support; and
    a printed circuit board, wherein at least one UV-transparent element is at least fixedly coupled to the printed circuit board, wherein the printed circuit board is attached to the support via a UV-curable adhesive provided between the support and the UV-transparent element.

2. The device according to claim 1, wherein the UV-transparent element is arranged along a perimeter of the printed circuit board.

3. The device according to claim 1, wherein the UV-transparent element is integrated into the printed circuit board.

4. The device according to claim 1, wherein the UV-transparent element is made of glass having a thickness of not more than 200 µm.

5. The device according to claim 1, wherein the UV-transparent element is made of glass having a thickness of not more than 100 µm.

6. The device according to claim 1, wherein the UV-transparent element is made of glass having a thickness of not more than 50 µm.

7. An electronic device for a medical implant, comprising:
    a counterpart support; and
    a printed circuit board, wherein at least one UV-transparent element is at least fixedly coupled to the printed circuit board, wherein the printed circuit board is attached to the counterpart via a UV-curable adhesive provided between the counterpart and the UV-transparent element.

8. The device according to claim 7, wherein the UV-transparent element is a joining component between the printed circuit board and a counterpart to the printed circuit board for establishing a rigid connection between the printed circuit board and the counterpart.

9. The device according to claim 8, wherein the UV-curable adhesive is a UV-curable resin.

10. The device according to claim 7, wherein the UV-transparent element is arranged along a perimeter of the printed circuit board.

11. The device according to claim 7, wherein the UV-transparent element is integrated into the printed circuit board.

12. The device according to claim 7, wherein the UV-transparent element is made of glass having a thickness of not more than 200 µm.

13. The device according to claim 7, wherein the UV-transparent element is made of glass having a thickness of not more than 100 µm.

14. The device according to claim 7, wherein the UV-transparent element is made of glass having a thickness of not more than 50 µm.

15. An implantable medical device comprising an electronic device according to claim 7.

16. A method for manufacturing an electronic device according to claim 7, with the steps of:
    providing a printed circuit board arrangement comprising a printed circuit board having at least one UV-transparent element coupled to or integrated in the printed circuit board in a position which is intended as interface for fixation of the printed circuit board;
    providing a counterpart on which the printed circuit board is to be fixated;

dispensing a UV-curable adhesive on the counterpart and/or the UV-transparent element in an area intended as interface for fixation of the printed circuit board;

illuminating the UV-transparent element with UV radiation and curing the UV-curable adhesive.

\* \* \* \* \*